(12) United States Patent
Cruz et al.

(10) Patent No.: US 9,111,869 B2
(45) Date of Patent: Aug. 18, 2015

(54) GLASS/CERAMICS REPLACEMENT OF EPOXY FOR HIGH TEMPERATURE HERMETICALLY SEALED NON-AXIAL ELECTRONIC PACKAGES

(75) Inventors: Victor Hugo Cruz, Los Fresnos, TX (US); David Francis Courtney, McAllen, TX (US)

(73) Assignee: Semtech Corporation, Camarillo ( * ) Notice: Subject to any disclaimer, the term of this patent is extended or adjusted under 35 U.S.C. 154(b) by 471 days.

(21) Appl. No.: 13/194,585

(22) Filed: Jul. 29, 2011

(65) Prior Publication Data

US 2013/0026490 A1    Jan. 31, 2013

(51) Int. Cl.
| | |
|---|---|
| *H01L 29/12* | (2006.01) |
| *H01L 23/495* | (2006.01) |
| *H01L 23/29* | (2006.01) |
| *H01L 23/00* | (2006.01) |
| *H01L 23/31* | (2006.01) |

(52) U.S. Cl.
CPC ........ *H01L 23/291* (2013.01); *H01L 23/49513* (2013.01); *H01L 23/49524* (2013.01); *H01L 23/49562* (2013.01); *H01L 23/49582* (2013.01); *H01L 24/34* (2013.01); *H01L 24/97* (2013.01); *H01L 23/3107* (2013.01); *H01L 24/05* (2013.01); *H01L 24/06* (2013.01); *H01L 24/29* (2013.01); *H01L 24/32* (2013.01); *H01L 24/45* (2013.01); *H01L 24/48* (2013.01); *H01L 24/83* (2013.01); *H01L 24/85* (2013.01); *H01L 24/92* (2013.01); *H01L 2224/04026* (2013.01); *H01L 2224/04042* (2013.01); *H01L 2224/05639* (2013.01); *H01L 2224/05655* (2013.01); *H01L 2224/06181* (2013.01); *H01L 2224/29139* (2013.01); *H01L 2224/29147* (2013.01); *H01L 2224/32245* (2013.01); *H01L 2224/37184* (2013.01); *H01L 2224/37639* (2013.01); *H01L 2224/37655* (2013.01); *H01L 2224/40247* (2013.01); *H01L 2224/45124* (2013.01); *H01L 2224/45139* (2013.01); *H01L 2224/4847* (2013.01); *H01L 2224/48247* (2013.01); *H01L 2224/48699* (2013.01); *H01L 2224/83439* (2013.01); *H01L 2224/83455* (2013.01); *H01L 2224/85439* (2013.01); *H01L 2224/85455* (2013.01); *H01L 2224/92246* (2013.01); *H01L 2224/92247* (2013.01); *H01L 2224/97* (2013.01); *H01L 2924/01029* (2013.01); *H01L 2924/1033* (2013.01); *H01L 2924/10253* (2013.01); *H01L 2924/10272* (2013.01); *H01L 2924/10329* (2013.01); *H01L 2924/15747* (2013.01)

(58) Field of Classification Search
USPC .................... 257/77, 676, E21.502, E23.037, 257/E29.089; 438/123
See application file for complete search history.

(56) References Cited

U.S. PATENT DOCUMENTS 4,839,716 A    6/1989  Butt
4,888,449 A *  12/1989 Crane et al. ................... 174/540
(Continued)

*Primary Examiner* — Lynn Gurley
*Assistant Examiner* — Vernon P Webb
(74) *Attorney, Agent, or Firm* — Fitzsimmons IP Law

(57) ABSTRACT

A high temperature, non-cavity package for non-axial electronics is designed using a glass ceramic compound with that is capable of being assembled and operating continuously at temperatures greater that 300-400° C. Metal brazes, such as silver, silver colloid or copper, are used to connect the semiconductor die, lead frame and connectors. The components are also thermally matched such that the packages can be assembled and operating continuously at high temperatures and withstand extreme temperature variations without the bonds failing or the package cracking due to a thermal mismatch.

14 Claims, 3 Drawing Sheets

(56) References Cited

U.S. PATENT DOCUMENTS 5,958,100 A 9/1999 Farnworth
7,435,993 B2 10/2008 Autry
2005/0116322 A1* 6/2005 Sando et al. .................. 257/676

* cited by examiner

GLASS/CERAMICS REPLACEMENT OF EPOXY FOR HIGH TEMPERATURE HERMETICALLY SEALED NON-AXIAL ELECTRONIC PACKAGES

BACKGROUND OF THE INVENTION

1. Field of the Invention

The present invention pertains to semiconductor packaging techniques, and more particularly, high-temperature, hermetically sealed non-axial electronic packages and methods of making.

2. Description of Related Art

Semi-conductor or integrated circuit devices and assemblies are typically contained in sealed packages to prevent exposure to and damage from their operating environment. Hermetic packages are typically formed from ceramic or metal components bonded together and sealed with glass or metal and are much more costly to manufacture. Non-hermatic packages are generally formed from ceramic, metal or plastic components and sealed with epoxy encapsulants. The epoxy encapsulants are sufficient to seal packages for (High Voltage>600v) silicon chips because the chip will go intrinsic at temperatures around 200° C. Accordingly the epoxy only needs to be capable of withstanding operating temperatures of about 175° C. These encapsulants, however, are not capable of withstanding the higher operating temperatures of the newer high temperature semiconductors, including silicon carbide, gallium arsenide, gallium nitride and diamonds.

Silicon carbide and other high temperature semiconductors, can actually operate at up to 600° C. and in fact operate more efficiently at higher temperatures around 300-400° C., but the current packages sealed with a thermoplastic epoxys fail at 250-300° C., and most are only rated to 175° C. Moreover, the thermoplastic materials do not self fuse or seal to metal as well as a ceramic glass and therefore are not able to provide a hermetic seal.

Axial glass bead packages are made using a glass ceramic compound and thus can operate a temperatures as high the 300-400° C. temperatures optimal for the high temperature semiconductor, but the method of making the glass bead package is only applicable to axial, i.e. single pin out, packages.

In addition, current bonding process for attaching the electrical interconnections between the semiconductor dies and the lead frame uses aluminum wire which would melts into die at higher assembly and operating temperatures required to melt a glass compound.

Thus, it would be desirable to provide a sealing material and bonding process for making semiconductor packages that can provide hermetically sealed packages capable of withstanding high assembly and operating temperatures. It would further be desirable to thermally match the coefficients of thermal expansion for the sealing material, bonding materials, die and other components in order to provide a semiconductor package that is capable of withstanding wide extremes in operating temperature.

SUMMARY OF THE INVENTION

The present invention is directed to materials and processes for making a non-cavity, molded glass/ceramic package that is hermetically sealed and can withstand assembly and operating temperatures greater than 200° C. where current epoxy encapsulants fail. The package is preferentially created from a molded glass/ceramic seal having a thermal coefficient of expansion of $<5.0\times10^{-6}$ and a glass transition temperature of $>450°$ C. The seal formed is hermetic and non-cavity. The glass/ceramic sealing material is thermally matched to the components of the semiconductor to allow the package to withstand wide thermal extremes.

In one embodiment of an electronic package in accordance with the present invention, the package comprises a lead frame having a die pad and at least one lead extending therefrom. A semiconductor die is bonded to the die pad with a metal braze, a connector adapted to provide electrical interconnections between the die and the semiconductor die is bonded to the die and die pad with metal brazes and a glass ceramic compound encapsulates the die, die pad, connector and a portion of all leads extending from the die pad to provide a high temperature, non-cavity package for non-axial electronics. The glass ceramic compound chemically bonds to the die, die pad, connector and a portion of all leads extending from the die pad to provide a hermetic seal. The glass ceramic compound preferably has a coefficient of thermal expansion (CTE) of less that $5.0\times10^{-6}$, more preferably between about $3.4-4.8\times10^{-6}$ and a transition temperature greater than about 450° C., more preferably between about 450-550° C. In some embodiments, the glass ceramic compound, die pad, connector and metal brazes are thermally matched. Using metal brazes for the connections and thermally matching the components allows the electronic package to be assembled and operated at higher temperatures, for example, between about 300-400° C. In some embodiments, the components are thermally matched to allow the resultant package to withstand extreme changes in operating temperature, for example from about −192° C. to about 400° C.

An embodiment of the electronic package in accordance with the present invention may be used to encapsulate and seal a single semiconductor die such as a Silicon Carbide die, Gallium Arsenide die or any other wide bandgap semiconductor chip. Alternatively, the electronic package may be used to encapsulate and seal multiple dies within a single package. In some embodiments, a heat sink may be included in the electronic package to allow for the use of smaller die with high power.

In another aspect of the invention, methods for making a packaged semiconductor device are described. A metal plated lead frame or header is provided, the lead frame or header having at least one package site comprising a die pad and at least one lead extending therefrom. A semiconductor die is bonded to the at least one package site using a metal braze, such as silver/copper or silver colloid. A connector such as a wire or clip is bonded to the semiconductor and the at least one lead to provide electrical interconnection. The connector is attached using a metal braze, such as silver/copper or silver colloid. The die, connector and at least part of the lead frame are encapsulated and sealed in a glass ceramic compound to form a hermetically sealed electronic package. The glass ceramic compound preferably has a coefficient of thermal expansion (CTE) of less than that $5.0\times10^{-6}$, more preferably between about $3.4-4.8\times10^{-6}$ and a transition temperature greater than about 450° C., more preferably between about 450-550° C. The components of the packaged semiconductor device, including the leadframe, metal brazes and glass ceramic compound are thermally matched to allow the package to be assembled and operated at higher temperatures, for example, between about 300-400° C. and to allow the resultant package to withstand extreme changes in operating temperature, for example from about −192° C. to about 400° C.

In one aspect of invention, a ceramic frit may be fused together around the semiconductor die, connector and at least part of the leadframe to encapsulate and seal the semiconductor die, connector and at least part of the leadframe in a hermetically sealed package. Alternatively, the semiconductor die, connector and at least part of the leadframe may be placed between two plates of the ceramic glass compound which are then heated above the reflow temperature for the ceramic glass compound to fuse together and around the semiconductor die, connector and at least part of the leadframe in order to encapsulate and seal the semiconductor die, connector and at least part of the leadframe in a hermetically sealed package.

In one aspect of this invention, the lead frame may comprise a single package site and the method may be used to manufacture a single packaged semiconductor device, for example for developmental work or a prototype. Alternatively, the lead frame may comprise a plurality of package sites. In such cases, the semiconductor and connector bonded to each package site and at least part of each package site is encapsulated and sealed within the glass ceramic compound and then each package site is singulated to create a plurality of packaged semiconductor devices. A bonding plate may also be used to connect a first integrated circuit die to a second die. Similarly, a bonding plate may be used to connect a first die, a second die, and a package lead frame, or any number of other structures necessary for electronic packaging.

Those skilled in the art will recognize additional embodiments and adaptations of the disclosed invention that are useful in the packaging of electronic integrated circuits, and such variations would also fall within the scope and spirit of the present invention. The invention is further described with reference to the attached figures, which are first described briefly below.

DETAILED DESCRIPTION OF THE PREFERRED EMBODIMENT

The invention provides an apparatus and method for manufacturing a hermetically sealed, void-less, non-axial electronic package that is capable of being assembled and operating at high temperatures. Semi-conductor dies made from Silicon Carbide, Gallium Arsenide, Gallium nitrate, diamonds or other high temperature semiconductors are capable of operating safely at temperatures of 300-400° C. and above, however, current electronic packages typically fail at 200° C. due to either the bonding between the components failing or cracking of the package because of thermal mismatch of the components. The present invention describes a novel process for providing metal on metal bonding between the semiconductor die and components and a glass ceramic compound that is thermally matched with the components in order to provide a package that is non-cavity, hermetically sealed and capable of operating at temperatures greater than 300-400° C. and withstanding wide thermal extremes.

Figure 1:
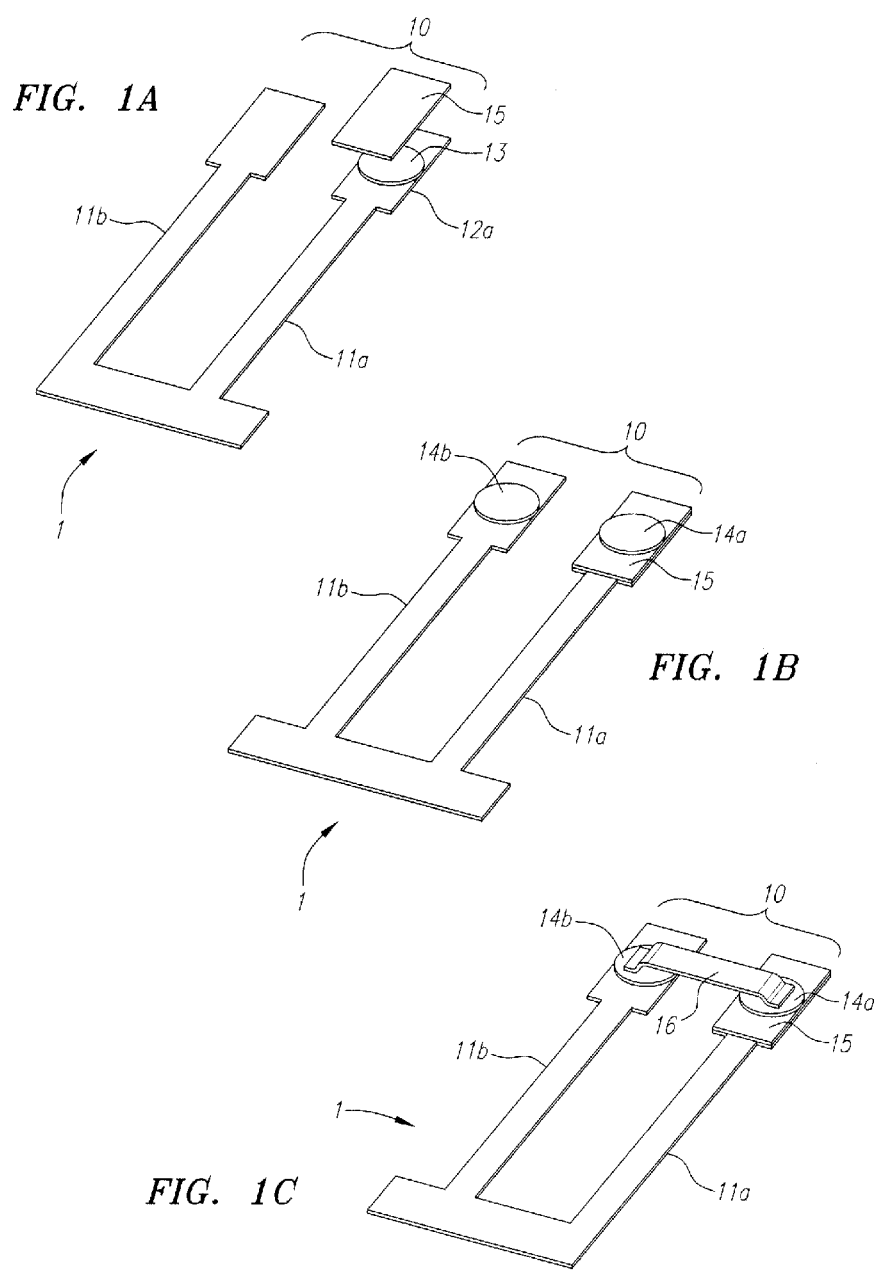
FIGS. 1a-1c are views of a semiconductor and connector bonded to a package site according to a method in accordance with the present invention to manufacture a semiconductor packaged device in a high temperature, hermetically sealed package.

Referring to FIGS. 1a-c, a process for bonding the semiconductor chip and electrical interconnections to the lead frame or header using a metal braze is provided. FIG. 1a illustrates one of a plurality of package sites 10 on a lead frame 1 for use in manufacturing a plurality of semiconductor packages. Each package site 10 comprises a metal plated die pad 12a for attaching the semiconductor die and a plurality of leads 11a-b which are connected to the die to provide the external electrical connections from the die 1. The illustrated embodiment depicts a two pin-out (or lead) design, however, in alternative embodiments, lead frame 10 could have 1, 2, 3, 4, 5, 6, 7, 8, 9, 10 or any number of leads extending therefrom. In other embodiments for manufacturing a single electronic package, a shaped tungsten header with any number of leads may be used instead of a lead frame. The lead frame 10 is preferably made of tungsten or molybdenum which has a coefficient of thermal expansion that closely matches that of the semiconductor chip. In alternative embodiments, the lead frame may be made of copper so that the leads out are more bendable. In such embodiments a tungsten pad is attached to the lead frame between the lead frame and the die. The tungsten pad will have a similar thermal coefficient to the die.

The lead frame 10 is plated with a layer of either nickel or silver depending upon the metallization of the semiconductor die to improve the die and connector attach quality. The metallization layer of the lead frame is chosen to match the metallization on the die and the type of connector used. For example, if a nickel plated clip is used as the connector, the die will be plated coated with a titanium barrier layer then plated with nickel layer and the lead frame will be nickel plated or nickel sintered and nickel plated. Alternatively, if a silver wedge is used with a silver plated clip or a silver wire bond is used for the connector, the die will be coated with a titanium barrier layer then plated with silver layer and the lead frame will be silver plated or nickel sintered and silver plated.

In FIG. 1A, the semiconductor die 15 is bonded to the die pad 12a of lead frame 10. The semiconductor die 15 is bonded to the die pad 12a using a metal braze 13a such as silver/copper or silver colloid. In FIG. 1b, a metal braze 14a-b is dispensed on the semiconductor 15 and the lead 11b to attach the connector that will provide the electrical interconnection between the semiconductor die 15 and lead 11b. The metal braze is silver/copper or silver colloid, which have a bonding temperature of between 790° C. to 960° C., and therefore, will be able to withstand high glass flow temperatures of between about 680-750° C. necessary to form glass ceramic seal. As shown in FIG. 1c, in some embodiments a wire clip 16, such as a nickel plated tungsten clip, can be used to provide the electrical connection between the lead 11b and the semiconductor die 15. In alternative embodiments, other suitable connectors capable of withstanding the high glass flow temperatures known in the art such as silver plated clips or silver wire attached with silver wedge bonds may be used to make the electrical connections.

Figure 2:
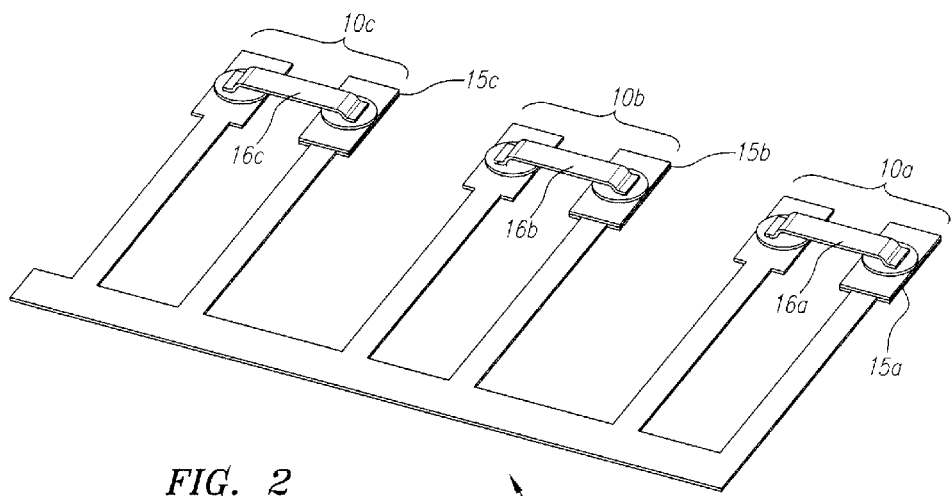
FIG. 2 is a top view of lead frame having a plurality package sites with a semiconductor and connector bonded thereon in according to a method in accordance with the present invention to manufacture a semiconductor packaged device in a high temperature, hermetically sealed package.
Figure 3:
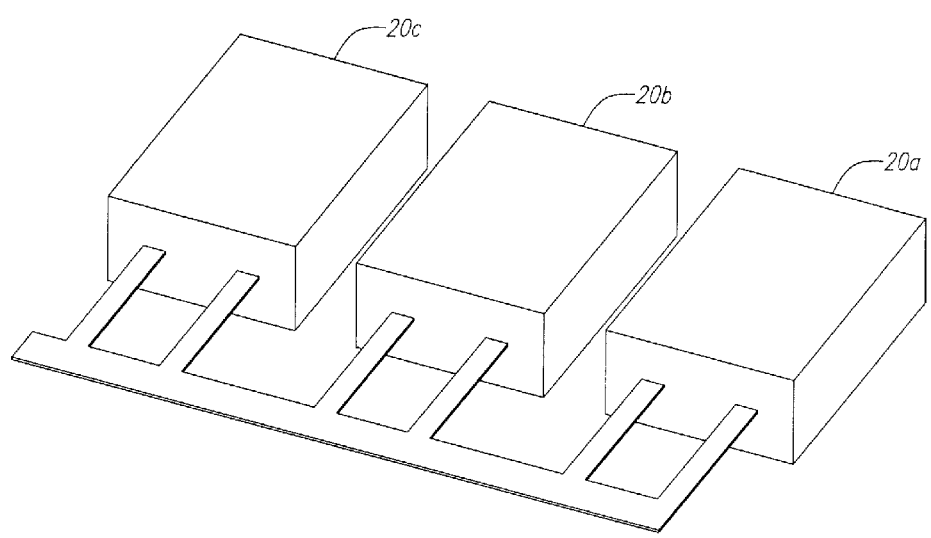
FIG. 3 is a top view of lead frame having a plurality package sites with a semiconductor and connector bonded thereon and encapsulated in a glass ceramic compound in according to a method in accordance with the present invention to manufacture a semiconductor packaged device in a high temperature, hermetically sealed package.

As shown in FIGS. 2-3, once the semiconductor dies 15a-c and connectors 16a-c have been attached to the package sites 10a-c on the lead frame 1, the glass ceramic compound may be applied to encapsulate and seal each package site 10a-c.

With reference to FIG. 2, an interface for the glass compound on the die is first formed by oxidizing the nickel plate on the die to which the glass will form a hermetic seal. As shown in FIG. 3, a glass ceramic compound is molded around each of the packages sites 10a-c to form packages 20a-c encapsulating and sealing the semiconductor die 15, clip 16 and at least part of the leads 11.

In some embodiments, the lead frame 1 is placed in a mold and the mold is filled with a glass frit, or slurry, comprising the granulated glass suspended in alcohol or water. The frit is dried and then heated until the frit sinters into a glass ceramic seal on the lead frame. In alternative embodiments, the lead frame 1 is placed in a mold between two glass plates. The glass plates are heated to fuse the glass plates together around the lead frame. In other embodiments, it is envisioned that other molding processes known in the art such as injection molding or hot molding could also be used. Unlike plastic encapsulants which do not self fuse or seal to metal as well, when the glass is molded around the lead frame, the glass chemically bonds to the metal layer on the die and lead frame and fuses to itself to form a hermetic seal around the die and connector. In addition, because the glass, unlike epoxies, is a non-porous substance and the glass is molded around the die and connector, the resultant packages is non-cavity and voidless.

The glass ceramic compound has a low coefficient of thermal expansion, which is thermally matched with the semiconductor chip, connector, lead frame and metal brazes. In some embodiments, the glass ceramic compound preferably has a CTE of less that $5.0 \times 10^{-6}$, more preferably between about $3.4\text{-}4.8 \times 10^{-6}$. In addition, the glass compound has a transition temperature of greater that 450° C., preferably between about 450-550° C. This allows for operation of the device and high operating temperature, for example about 300-400° C. and over extreme temperature ranges, for example from about −192° C. to about 400° C., without cracking of the package. In some embodiments, the glass ceramic compound is preferably made of lead borosilicate glass or zinc borosilicate glass; however, any glass ceramic compound having the above characteristics would fit within the scope and spirit of the invention.

Figure 4A:
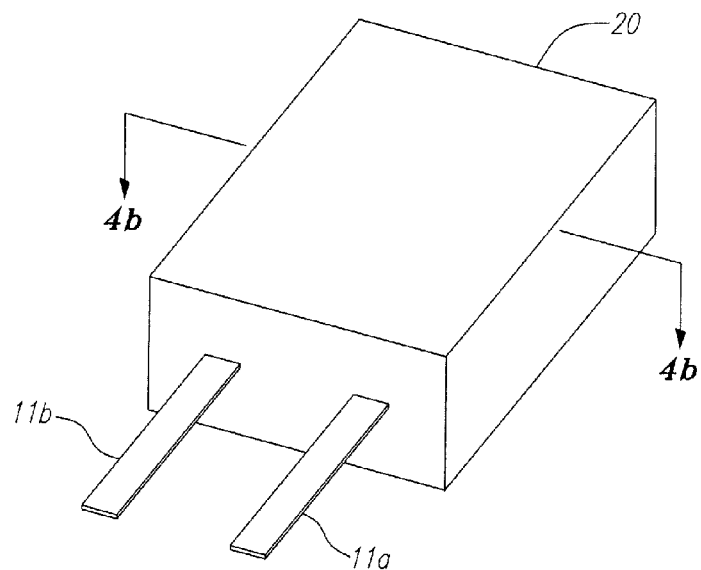
FIG. 4a is a top view of a single non-axial, void-less device package according to the present invention.
Figure 4B:
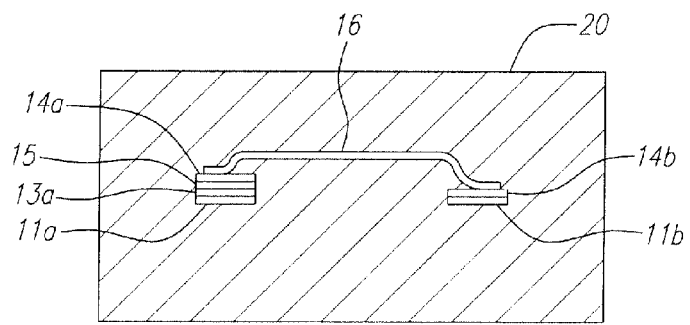
FIG. 4b is a cross section of a non-axial, void-less device package incorporating metal to metal connections between the semiconductor die, connector and lead frame in accordance with an embodiment of the present invention

As discussed above, the methods described herein can be used to make individual electronic packages on a shaped tungsten header or simultaneously on a plurality of sites on a lead frame to make a plurality of semiconductor packages in a batch process. FIGS. 4a-b illustrates a high temperature, hermetically sealed, non-cavity, void-less semiconductor package 20 according to the present invention that has been singulated from lead frame 1. As shown in FIG. 4a, the illustrated package is a two pin out 11a-b design; however, it should be understood the methods and processes described herein can be used with any number of leads and any multiple pin packages known in the art, such as TO packages or other through-hole packages, SMD packages, e.g., Dpak, D2pak and SOIC, to provide packages that are hermetically sealed and capable of operating at higher temperatures needed for high temperature semiconductors such as silicon carbide, gallium arsenide, gallium nitride, diamond, or other high temperature semiconductors known in the art. The methods and processes can also be used to provide lower cost hermetically sealed packages for silicon chips.

FIG. 4b illustrates a cross section of the semiconductor package 20 shown in FIG. 4a taken along the line 4b-4b. The glass compound 21 encapsulates and surrounds the die pad 12a (not shown), semiconductor die 15, connector 16, and first end of leads 11a-b in a non-cavity, void-less package 20. The metal brazes 14a-b between the connector 16a, die 15 and lead 11b and metal braze 13a between the die 15 and lead 11a are also encapsulated within the glass compound. Because the metal brazes have a bonding temperature of between 790° C. to 960° C., they are able to withstand the reflow temperatures of between about 680-750° C. needed to create the glass ceramic seal around the package site and additionally are able to withstand subsequent operating temperatures of between about 300-400° C., or even greater than about 400° C. which are optimal for high temperature semiconductors.

In some embodiments, a heat sink may optionally be bonded to the semiconductor die or substrate. A heat sink is not necessary because silicon carbide dies are able to operate at higher temperatures and conduct heat and in addition the package is able to dissipate heat because of the thermal match. Likewise, the dies, and packages, can be made much smaller. All of which features make these packages advantageous for high performance and extreme environments such as automotive aerospace and harsh environmental applications. In some embodiments, in order to use a smaller die with more power, for example, a three amp diode can be used as a nine amp diode when a heat sink is added to the package. The heat sink may be bonded to the die or substrate using the same metallization layers as the die or ceramic substrate and with a metal brace as described above. The heat sink is then overmolded along with the rest of the components and encapsulated in the resultant electronic package The invention provides a cost-effective and robust solution to creating high temperature, hermetically sealed, non-axial semiconductor packages, and it should be clear to those skilled in the art that certain advantages of the invention have thereby been achieved. Other advantages, applications, and modifications of the invention may also be evident to those skilled in the art and would also fall within the scope and spirit of the present invention. The invention is solely defined by the following claims.

What is claimed is:

1. The method for making a packaged semiconductor device comprising:
   providing a metal plated pad, leadframe having at least one package site, the at least one package site having at least one lead;
   mounting a semiconductor die on the at least one package site using a first metal braze, said first metal braze comprising a silver colloid;
   bonding a connector to the semiconductor die and the at least one lead using a second metal braze, said second metal braze comprising said silver colloid; and
   encapsulating and sealing the semiconductor die, the connector and at least part of the metal plated pad, leadframe and the at least one lead within a glass ceramic compound to form a hermetically sealed electronic package, wherein the package is non-cavity and void-less, and said glass ceramic compound is heated to chemically bond said glass ceramic compound to said metal plated pad, said semiconductor die and said connector;
   wherein the connector, the metal plated pad, the leadframe, the semiconductor and the glass ceramic are thermally matched and wherein the glass ceramic has a CTE<$5.0 \times 10^{-6}$ and a transition temperature>450° C.

2. The method of claim 1, wherein the step of encapsulating and sealing comprises overmolding a slurry of the ceramic frit to fuse together around the semiconductor die, the connector and at least part of the leadframe and the at least one lead.

3. The method of claim 1, wherein the step of encapsulating and sealing comprises of placing the semiconductor die, the connector and the at least part of the pad, leadframe and at least one lead between two plates of the ceramic glass and raising the temperature above the reflow temperature for the glass ceramic compound to fuse the plates together around the semiconductor die, the connector and the at least part of the pad, leadframe and the at least one lead.

4. The method of claim 1, wherein the metal braze is thermally match with the glass ceramic.

5. The method of claim 1, wherein the metal plated pad or leadframe comprises a tungsten or molybdenum substrate having a nickel layer sintered attached to copper leadframe thereon.

6. The method of claim 5 wherein the metal plated pad or leadframe further comprises a nickel plated layer thereon.

7. The method of claim 5 wherein the metal plated pad or leadframe further comprises a silver plated layer thereon.

8. The method of claim 1, wherein the connector comprises a clip.

9. The method of claim 6, wherein the clip comprises a nickel plated tungsten clip.

10. The method of claim 1 wherein the connector comprises a wire.

11. The method of claim 1, wherein the glass ceramic comprises borosilicate glass.

12. The method of claim 1, wherein the glass ceramic has a CTE between about $3.4\text{-}4.8\times10^{-6}$.

13. The method of claim 1, wherein the glass ceramic has a transition temperature between about 450° C.-550° C.

14. The method of claim 1, wherein the metal plated pad, leadframe comprises a plurality of package cites, further comprising;
   mounting a semiconductor die on each package site using a metal braze;
   bonding a connector to each semiconductor die and the at least one lead at each package site using a metal braze; and
   encapsulating and sealing each package site; and
   singulating each encapsulated and sealed package site.

* * * * *